United States Patent
Kaptanoglu et al.

(10) Patent No.: US 7,030,650 B1
(45) Date of Patent: *Apr. 18, 2006

(54) FRACTURABLE INCOMPLETE LOOK UP TABLE AREA EFFICIENT LOGIC ELEMENTS

(75) Inventors: Sinan Kaptanoglu, Belmont, CA (US); David Lewis, Toronto (CA); Bruce Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/985,574

(22) Filed: Nov. 10, 2004

Related U.S. Application Data

(63) Continuation of application No. 10/365,647, filed on Feb. 11, 2003, now Pat. No. 6,888,373.

(51) Int. Cl.
    *H03K 19/177* (2006.01)
(52) U.S. Cl. .......................................... 326/40; 39/41
(58) Field of Classification Search ............. 326/37–41
    See application file for complete search history.

(56) References Cited

U.S. PATENT DOCUMENTS

| | | | |
|---|---|---|---|
| 5,260,610 A | 11/1993 | Pederson et al. |
| 5,260,611 A | 11/1993 | Cliff et al. |
| 5,274,581 A | 12/1993 | Cliff et al. |
| 5,295,090 A | 3/1994 | Hsieh et al. |
| 5,349,250 A | 9/1994 | New |
| 5,359,242 A | 10/1994 | Veenstra |
| 5,359,468 A | 10/1994 | Rhodes et al. |
| 5,365,125 A | 11/1994 | Goetting et al. |
| 5,436,575 A | 7/1995 | Pederson et al. |
| 5,481,206 A | 1/1996 | New et al. |
| 5,481,486 A | 1/1996 | Cliff et al. |
| 5,483,478 A | 1/1996 | Chiang |
| 5,485,103 A | 1/1996 | Pedersen et al. |
| 5,488,316 A | 1/1996 | Freeman et al. |
| 5,500,608 A | 3/1996 | Goetting et al. |
| 5,523,963 A | 6/1996 | Hsieh et al. |
| 5,546,018 A | 8/1996 | New et al. |
| 5,629,886 A | 5/1997 | New |
| 5,631,576 A | 5/1997 | Lee et al. |
| 5,672,985 A | 9/1997 | Lee |

(Continued)

FOREIGN PATENT DOCUMENTS

EP    0 569 135 A2    11/1993

(Continued)

OTHER PUBLICATIONS

Ahmed, E. et al. "The Effect of LUT and Cluster Size on Deep-Submicron FPGA Performance and Density," *FPGA '2000*, Monterey, CA, pp. 3-12, no month.

(Continued)

*Primary Examiner*—Vibol Tan
(74) *Attorney, Agent, or Firm*—Beyer Weaver & Thomas, LLP

(57) ABSTRACT

Disclosed is a configurable logic circuit that includes at least 6 inputs and at least two outputs. The configurable logic element can carry out only a subset of all 6-input logic functions and, thus, requires a substantially smaller silicon area than a 6-LUT that can perform all 6-input logic functions. Also, the configurable logic circuit can be configured such that a first subset of the inputs drive one of the outputs and a second subset of the inputs drive another output.

25 Claims, 4 Drawing Sheets

U.S. PATENT DOCUMENTS

| | | | |
|---|---|---|---|
| 5,675,262 | A | 10/1997 | Duong et al. |
| 5,724,276 | A | 3/1998 | Rose et al. |
| 5,761,099 | A | 6/1998 | Pedersen |
| 5,818,255 | A | 10/1998 | New et al. |
| 5,889,411 | A | 3/1999 | Chaudhary |
| 5,898,319 | A | 4/1999 | New |
| 5,898,602 | A | 4/1999 | Rothman et al. |
| 5,905,385 | A | 5/1999 | Sharpe-Geisler |
| 5,909,126 | A | 6/1999 | Cliff et al. |
| 5,920,202 | A | 7/1999 | Young et al. |
| 5,926,036 | A | 7/1999 | Cliff et al. |
| 5,999,016 | A | 12/1999 | McClintock et al. |
| 6,021,423 | A | 2/2000 | Nag et al. |
| 6,051,992 | A | 4/2000 | Young et al. |
| 6,084,427 | A | 7/2000 | Lee et al. |
| 6,107,822 | A | 8/2000 | Mendel et al. |
| 6,107,827 | A | 8/2000 | Young et al. |
| 6,118,300 | A | 9/2000 | Wittig et al. |
| 6,154,052 | A | 11/2000 | New |
| 6,154,053 | A | 11/2000 | New |
| 6,154,055 | A | 11/2000 | Cliff et al. |
| 6,157,209 | A | 12/2000 | McGettigan |
| 6,191,610 | B1 | 2/2001 | Wittig et al. |
| 6,191,611 | B1 | 2/2001 | Altaf |
| 6,215,327 | B1 | 4/2001 | Lyke |
| 6,249,144 | B1 | 6/2001 | Agrawal et al. |
| 6,288,570 | B1 | 9/2001 | New |
| 6,297,665 | B1 | 10/2001 | Bauer et al. |
| 6,323,680 | B1 | 11/2001 | Pedersen et al. |
| 6,400,180 | B1 | 6/2002 | Wittig et al. |
| 6,501,296 | B1 * | 12/2002 | Wittig et al. .................. 326/39 |
| 6,529,041 | B1 | 3/2003 | Ng et al. |
| 6,888,373 | B1 | 5/2005 | Kaptanoglu et al. |
| 2001/0028257 | A1 | 10/2001 | Kaptanoglu |
| 2001/0030555 | A1 | 10/2001 | Witting et al. |
| 2004/0155677 | A1 | 8/2004 | Lewis et al. |

FOREIGN PATENT DOCUMENTS

| | | | |
|---|---|---|---|
| EP | 0 569 135 | A3 | 11/1993 |
| EP | 0 569 135 | B1 | 11/1993 |
| EP | 0 701 328 | A2 | 3/1996 |
| EP | 0 701 328 | A3 | 3/1996 |

OTHER PUBLICATIONS

Altera Corp. (Dec. 2002). "Stratix FPGA Family Data Sheet," Preliminary Information, Ver. 3.0, pp. 1, 11-19.

Altera Corp. (Feb. 2002). "APEX 20K Programmable Logic Device Family," Ver. 4.3, pp. 1-29.

Altera Corp. (Jun. 1999). "FLEX 8000 Programmable Logic Device Family", Ver. 10.01, pp. 349-364.

Altera Corp. (Mar. 2001). "FLEX 10K Embedded Programmable Logic Device Family," Ver. 4.1, pp. 1-28.

Altera Corp. (Mar. 2001). "FLEX 6000 Programmable Logic Device Family," Ver. 4.1, pp. 1-17.

Altera Corp. (Mar. 2002). "Mercury Programmable Logic Device Family," Ver. 2.0, pp. 1-34.

Cherepacha, D. et al. "DP-FPGA: An FPGA Architecture Optimized for Datapaths," *VLSI Design 1996* 4(4):329-343, no month.

European Search Report mailed Aug. 4, 2005 for European Application No. 04 25 0707 filed Feb. 10, 2004, 6 pages.

Kaptanoglu, S. et al. "A New High Density And Very Low Cost Reprogrammable FPGA Architecture," *FPGA 99*, Monterey, CA, pp. 3-12, no month.

Kouloheris, J. L. et al. "FPGA Area Versus Cell Granularity-Lookup Tables and PLA Cells," *FPGA '92*, pp. 9-14, no month.

Lattice Corp. (Jan. 2003). "Orca® Series 2 Field-Programmable Gate Arrays," pp. 1-25.

Rose, J. et al. (Oct. 1990). "Architecture of Field-Programmable Gate Arrays: The Effect of Logic Block Functionality on Area Efficiency," *J. of Solid-State Circuits* 25(5):1217-1224.

XILINX, (Dec. 6, 2002). "VirtexTM—II Platform FPGAS: Detailed Description", Advance Product Specification, Ver. 2.1.1, 40 pgs.

* cited by examiner

FRACTURABLE INCOMPLETE LOOK UP TABLE AREA EFFICIENT LOGIC ELEMENTS

CROSS REFERENCE TO RELATED APPLICATIONS

This application is a continuation of U.S. patent application Ser. No. 10/365,647 filed Feb. 11, 2003 (is now a U.S. Pat. No. 6,888,373) and entitled FRACTURABLE INCOMPLETE LOOK UP TABLE FOR AREA EFFICIENT LOGIC ELEMENTS.

BACKGROUND OF THE INVENTION

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs may include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. The LE is typically the smallest repeatable functional block of a PLD.

LUTs generally include configurable elements holding configuration data that determines the particular function or functions carried out by the logic element. A typical LUT circuit may include ram bits that hold data (a "1" or "0"). However, other types of configurable elements may be used. Some examples may include static, magnetic, ferro-electric or dynamic random access memory, electrically erasable read-only memory, flash, fuse, and anti-fuse programmable connections. For purposes herein, the generic term "memory element" will be used to refer to any programmable element that may be configured to determine functions implemented by a LUT. A typical LUT circuit used as a logic element provides an output signal that is a function of multiple input signals. The particular logic function that is provided may be determined by programming the LUT's memory elements.

The k-value of a LUT is the maximum number of inputs for a combinatorial logic function that the LUT will perform. For example a LUT of k=4, or 4-LUT, will perform combinatorial logic functions of up to 4 inputs. A k-LUT can also perform logic functions having fewer than k inputs. And, a "complete" k-LUT can perform all possible k input combinatorial logic functions as well as all possible j input functions where j is less than k.

The higher the k-value of a LUT, the greater the number of logic functions the LUT will perform. Additionally, typically, the higher the k-value of a LUT, the higher the performance of the LUT, where performance indicates the clock speed of a LUT averaged over different logic functions performed by the LUT. Thus, using a higher k-value LUT in PLD design may be desirable. However, generally, the higher the k-value of the LUT, the greater the silicon area that is taken up by the LUT, and therefore, the more expensive it is to implement.

BRIEF SUMMARY OF THE INVENTION

A logic device in accordance with the present invention includes a LUT of k=6 ("6-LUT") which is incomplete and fracturable. Specifically, a configurable logic circuit of the present invention includes at least 6 inputs and at least two outputs. The configurable logic element is completely configurable with no more than 63 memory bits. The configurable logic circuit of the present invention can be configured such that the 6 inputs drive just one of the outputs to generate a 6 input logic function. Additionally, because the configurable logic circuit is fracturable, it can also be configured such that a first subset of the inputs drive a first output and a second subset of the inputs drive a second output. In this way, the configurable logic circuit can simultaneously carry out two different logic functions each having fewer than 6 inputs.

Though a configurable logic circuit in accordance with the present invention cannot perform all 6 input logic functions, it is designed to implement a relatively high percentage of commonly used 6 input logic functions and retain a relatively high permutability. However, because the configurable logic circuit can only carry out a subset of all 6 input logic functions, it takes up significantly less silicon area in an FPGA, and can therefore be less costly to produce and use. Additionally, because an at least 6 input configurable logic circuit in accordance with the present invention can perform more than one logic function of fewer than 6 inputs, function packing can be utilized to further increase area efficiency.

In another aspect of the present invention, a configurable logic circuit includes at least 7 inputs and at least 3 outputs. At least one of the 7 inputs can be configured to directly drive one of the outputs. The configurable logic element is completely configurable with no more than 32 programmable memory bits. The configurable logic circuit of the present invention can be configured such that the 6 inputs are configured to drive just one of the outputs to generate a 6 input logic function. Additionally, because the configurable logic circuit is fracturable, it can also be configured such that a first subset of the 7 inputs drive one of the outputs and a second subset of the 7 inputs drive another of the outputs.

Because the configurable logic circuit of this second aspect of the present invention includes an input that can directly drive an output, register packing and combinatorial logic may be implemented. Thus, in addition to the advantages discussed above, a configurable logic circuit of this second aspect of the present invention can advantageously reduce the effective silicone area, and thus cost, required to implement a given FPGA configuration.

DETAILED DESCRIPTION OF THE INVENTION

Figure 1:
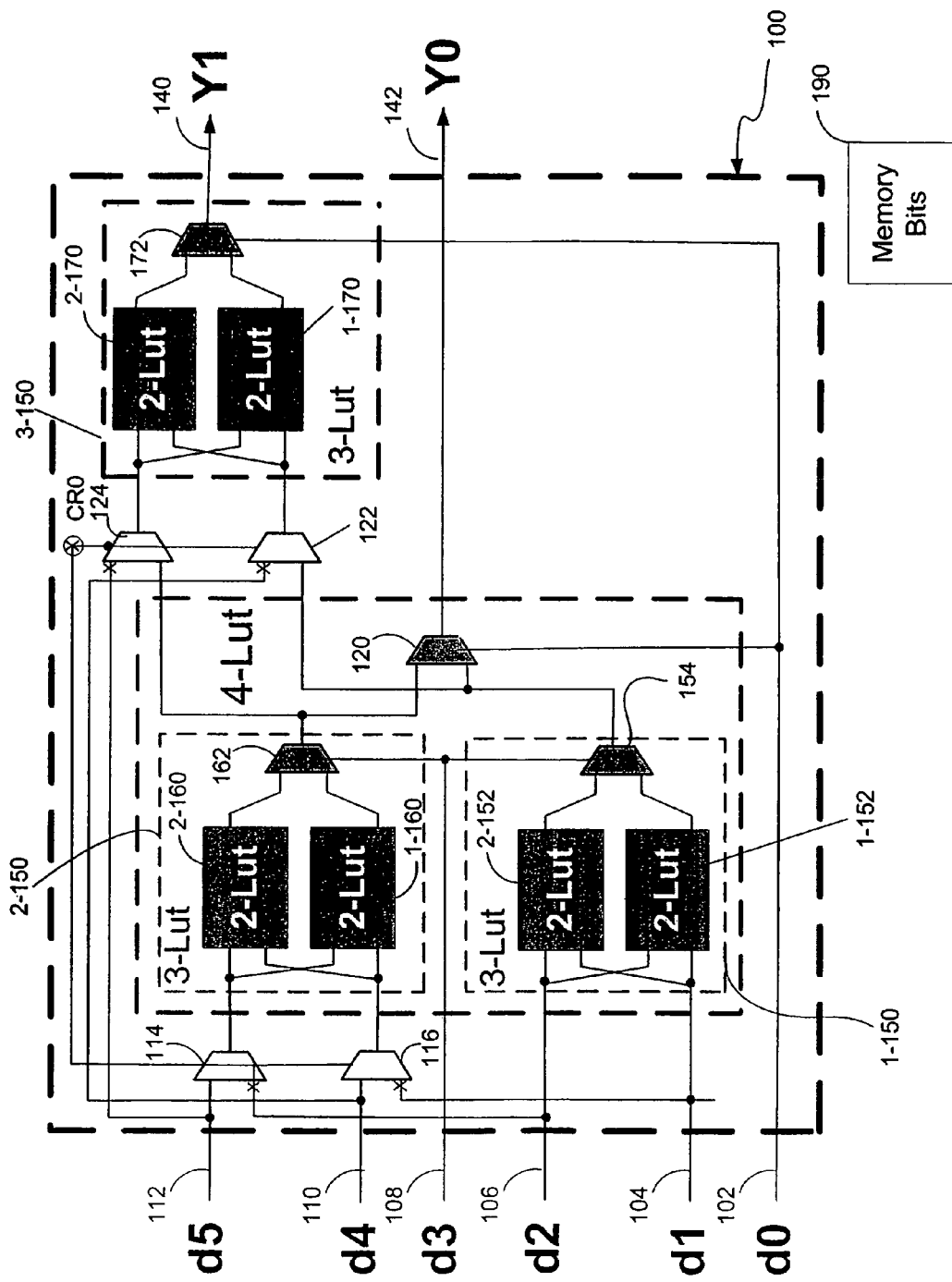
FIG. 1 is a schematic diagram of a first embodiment of an incomplete, fracturable 6-LUT in accordance with the present invention.

FIG. 1 is a schematic diagram of one embodiment of configurable logic circuit in accordance with the present invention. FIG. 1 shows 6-LUT 100, which includes six inputs 102, 104, 106, 108, 110 and 112 for accepting input signals d0, d1, d2, d3, d4 and d5, respectively, of a logic function having 6 or fewer inputs. 6-LUT 100 also includes 3 complete 3-LUTS 1-150, 2-150 and 3-150 each including 2 complete 2-LUTS and a 2-input multiplexer ("2-MUX"). Specifically, a first 3-LUT 1-150 includes 2-LUTs 1-152 and 2-152 driving the inputs of 2-MUX 154; a second 3-LUT 2-150 includes 2-LUTs 1-160 and 2-160 driving the inputs of 2-MUX 162; and a third 3-LUT 3-150 includes 2-LUTs 1-170 and 2-170 driving the inputs of 2-MUX 172. First 3-LUT 1-150 and second 3-LUT 2-150 driving the inputs of 2-MUX 120 make up a 4-LUT 130. Although in the embodiment shown in FIG. 1, 6-LUT 100 has only 6 inputs and 2 outputs, as will be discussed below, a 6-LUT in accordance with the present invention can include additional inputs and outputs.

Inputs 104, 106 and 108 drive first 3-LUT 1-150 with input 108 driving the selection input of 2-MUX 154. Second 3-LUT 2-150 can be driven by any two of inputs 104, 106, 110 and 112 by controlling the selection inputs of 2-MUXs 114 and 116. The selection inputs of 2-MUXs 114 and 116 are controlled by a configurable memory bit CR0. A third input to second 3-LUT 2-150, which is the selection input of 2-MUX 162, is controlled by input 108.

Output of first 3-LUT 1-150 drives 2-MUX 120 and 2-MUX 122. Output of second 3-LUT 2-150 drives 2-MUX 120 and 2-MUX 124. Input 110 can also drive 2-MUX 122 and input 112 can also drive 2-MUX 124. The output of 2-MUX 122 and the output of 2-MUX 124 drive third 3-LUT 3-150. Whether the signal of the output of first 3-LUT 1-150 or the signal of input 110 is fed through 2-MUX 122 to drive a first input of third 3-LUT 3-150 is determined by memory bit CR0, which drives the selection input of 2-MUX 122. And, whether the signal of the output of second 3-LUT 2-150 or the signal of input 112 is fed through 2-MUX 124 to drive a second input of third 3-LUT 3-150 is also determined by memory bit CR0, which drives the selection input of 2-MUX 124. A third input of third 3-LUT 3-150, which is the selection input of 2-MUX 172, is driven by input 102, which also drives the selection input of 2-MUX 120 of 4-LUT 130.

As will be discussed below, 6-LUT 100 is fracturable, and therefore must have more than one output. A first output 140 is driven from 2-MUX 172 of third 3-LUT 3-150. A second output 140 is driven from the output of 2-MUX 120 of 4-LUT 130.

6-LUT 100 also includes memory bits 190. As is understood by those skilled in the art, memory bits 190 are programmable to hold configuration data that determines the particular function or functions carried out by 6-LUT 100. A complete 6-LUT would require 64 bits to be programmed to unambiguously define a 6 input logic function to be performed by the complete 6-LUT. However, as will be discussed below, 6-LUT 100 is incomplete and, therefore, requires fewer than 64 memory bits to unambiguously define a logic function. Specifically, memory bits 190 of 6-LUT 100 preferably include fewer than 32 memory bits and more preferably include only 24 memory bits, not including memory bit CR0. In the embodiment shown in FIG. 6, 25 memory bits, including memory bit CR0, are sufficient to unambiguously define a logic function in 6-LUT 100.

Memory bits 190 are preferably RAM bits but can be any one of the memory elements defined above. The programming of memory bits 190 is preferably implemented after fabrication of 6-LUT 100. However, programming of memory bits 190 may also be achieved through mask programming during fabrication of 6-LUT 100.

An incomplete 6-LUT in accordance with the present invention, such as 6-LUT 100, can perform logic functions having up to 6 inputs and, as discussed further below, can be fractured to perform two logic functions each having fewer than 6 inputs. Incomplete 6-LUT 100, however, requires less area in a PLD to implement than a full 6-LUT would, and is therefore advantageously less expensive to implement than a full 6-LUT. And, as discussed further below, incomplete 6-LUT 100 retains much of the performance of a full 6-LUT.

As noted above, an incomplete 6-LUT in accordance with the present invention, such as 6-LUT 100, is fracturable, that is, it can simultaneously perform two logic functions each having fewer that 6 inputs. For example, an incomplete 6-LUT in accordance with the present invention can be configured to perform a 5 input logic function along with a 1 input logic function (5+1 fracturing), a 4+2 fracturing or a 3+3 fracturing without sharing any inputs. An incomplete 6-LUT in accordance with the present invention can also be fractured to perform two logic functions that share inputs, such as, without limitation, a 4+3 fracturing, a 5+2 fracturing or a 5+3 fracturing. In general, an incomplete 6-LUT in accordance with the present invention can be configured such that some 6-n of the at least 6 inputs are configured to drive one output to generate a 6-n input logic function and some 6-m of the at least 6 inputs are configured to drive the second output to generate a 6-m input logic function, where m and n are each integers with m ranging from 3 to 5, inclusive, and n ranging from 1 to 5, inclusive. That is, a first subset of the 6 inputs can drive one output and a second subset of the at least 6 inputs can drive the second output.

Figure 2:
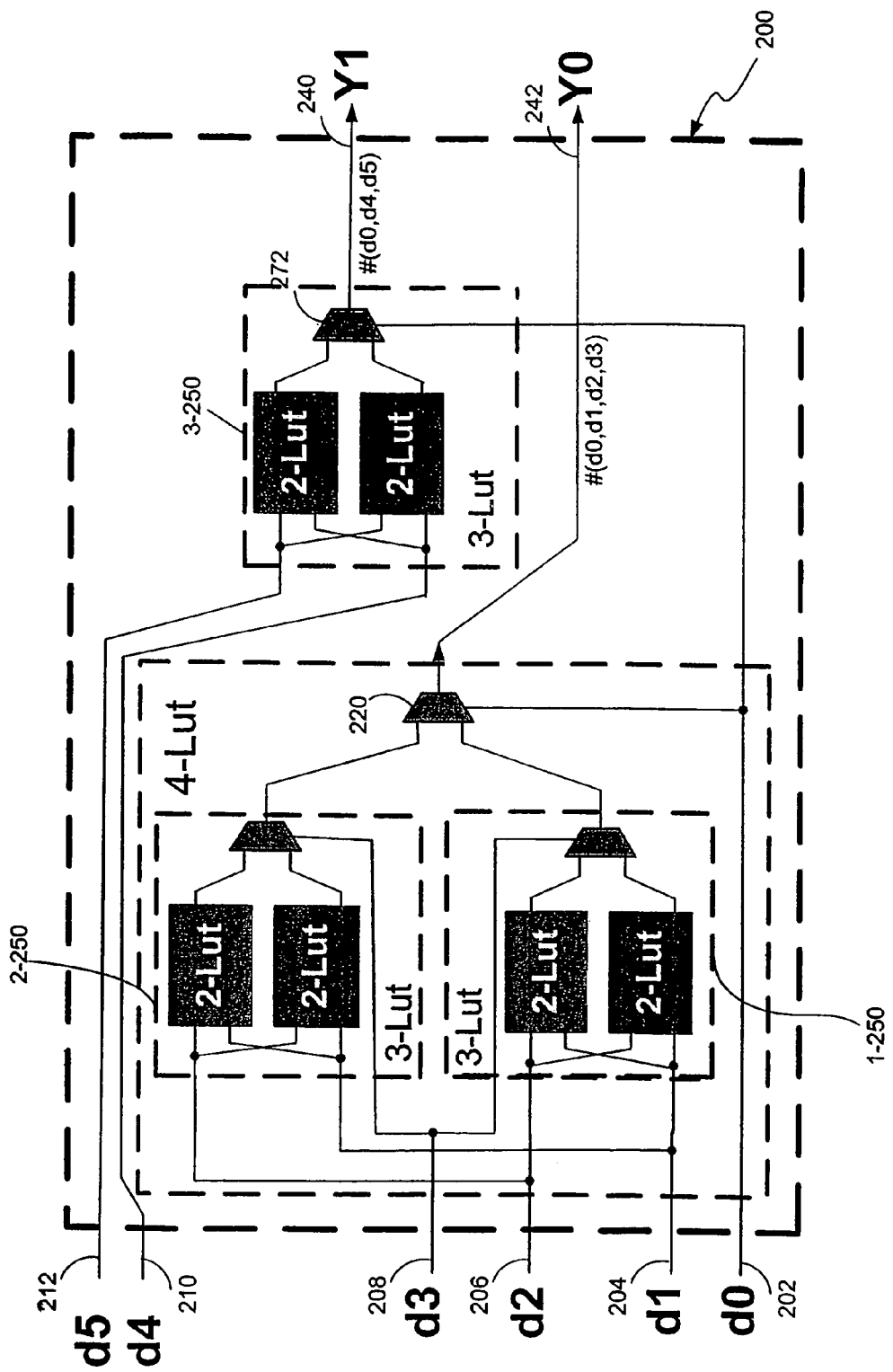
FIG. 2 is a schematic diagram of the incomplete, fracturable 6-LUT shown in FIG. 1 configured to carry out a 4+3 fracturing.

An example of a configuration of 6-LUT 100 fractured to perform a 4-input logic function and a 3-input logic function (4+3 fracturing) sharing 1 input is shown in FIG. 2. FIG. 2 is a schematic diagram of 6-LUT 200 which is 6-LUT 100, shown in FIG. 1, with memory bit CR0 set to 1. In such a configuration, input 202 drives selection inputs to both 2-MUX 220 and 2-MUX 272, and inputs to 3-LUTs 1-250 and 2-250 are driven by inputs 204, 206 and 208. Inputs 210 and 212 drive 3-LUT 3-250. In this way, output 240 provides the output of a 3 input logic function of input signals d0, d4 and d5 and output 242 provides the output of a 4 input logic function of input signals d0, d1, d2 and d3, with the 3 input logic function sharing input signal d0 with the 4 input logic function.

An incomplete 6-LUT in accordance with the present invention can perform a relatively high percentage of relatively commonly used 6-LUT, LUT masks. While the total number of inequivalent 6 input logic functions, or 6-LUT masks, is well understood to be 264, only a small fraction of these are regularly used when programming PLDs.

While the percentage of the total number of all 6-input logic functions configurable in 6-LUT 100 is relatively small, the percentage of relatively commonly used 6-input logic functions configurable in 6-LUT 100 is relatively high. This is advantageously achieved at an area that is reduced over an incomplete 6-LUT that can perform a higher percentage of all 6-input logic functions. Specifically, an complete 6-LUT disclosed in co-pending U.S. Patent Application entitled Logic Circuitry with Shared Lookup Table, by B. Pedersen and filed on Jan. 24, 2003 ("Pederson"), can, because it is complete, perform all 6-input logic functions. However, 6-LUT 100 of the present invention is smaller in physical silicon area than the 6-LUT of Pederson. Additionally, this area efficiency is obtained at only a very slight loss is average circuit speed.

In addition to actually requiring less silicon area to perform many of the functions of a complete or nearly complete LUT, as discussed above, a 6-LUT in accordance with the present invention is fracturable. Thus, when configuring and FPGA populated with 6-LUTs such as 6-LUT 100, function packing can be used to improve the efficiency with respect to silicon area of the configuration being implemented. Specifically, when a configuration requiring not only 6, but also 5, 4, 3, and 2 input logic functions is implemented, pairs of the 5, 4, 3, and 2 input functions can be configured on a single 6-LUT rather than taking up a second 6-LUT.

Another important measure of LUT performance is permutability. The permutability index ("PI") provides a measure for the permutability of a LUT and can be defined as how may inputs are available to permute the signals for a given mask. It can be shown that for any complete k-LUT, the PI is simply k for any logic function of k-inputs and remains k when averaged over the PI for all logic functions up to and including k-inputs. For example, the PI for a complete 6-LUT, averaged over all logic functions up to and including 6 inputs, is 6. Thus the average PI over all logic functions up to and including k-inputs is 6.

For an incomplete k-LUT, the permutability will generally be different depending upon the particular mask being implemented, and will generally be less than k for k-input logic functions. Therefore, the average PI over all logic functions up to and including k inputs for an incomplete LUT will generally be less than k. For example, for an incomplete 6-LUT, while the PI for 1 and 2 input functions may be 6, the PI for 3, 4, 5 and 6 input functions will likely be less than 6. Thus, the average PI over all logic functions up to and including 6 inputs will be less than 6. Relatively high permutability, however, provides greater flexibility and higher performance because it allows more important signals in a logic function to be routed on faster inputs. Advantageously, 6-LUT 100 shown in FIG. 1 retains a relatively high average permutability over logic functions up to and including 6 inputs.

Figure 3:
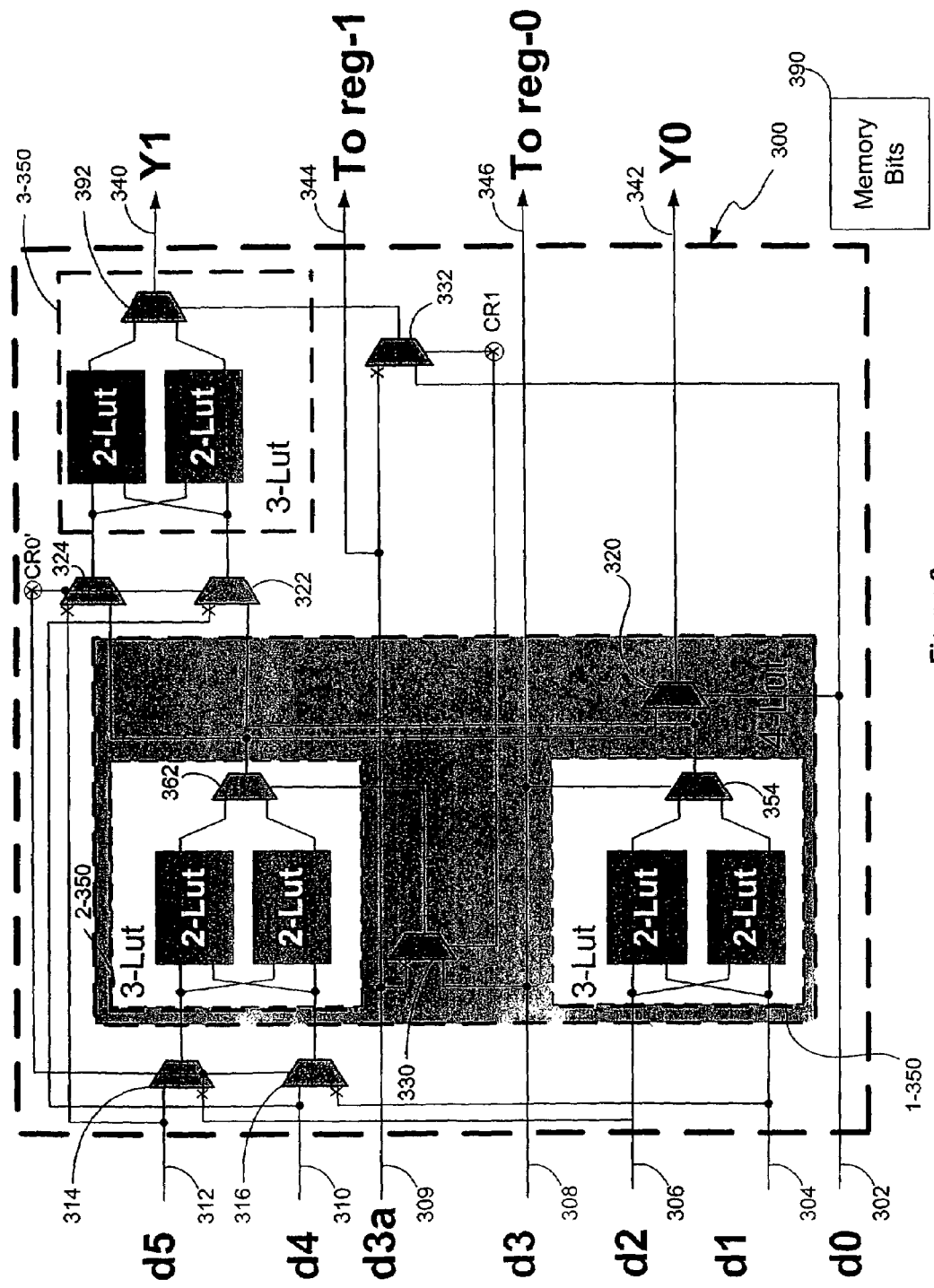
FIG. 3 is a schematic diagram of a second embodiment of an incomplete, fracturable 6-LUT in accordance with the present invention.

FIG. 3 is a schematic diagram of an alternative embodiment of an incomplete, fracturable 6-LUT 300 in accordance with the present invention. Like 6-LUT 100, shown in FIG. 1, 6-LUT 300 includes 6 inputs: 302, 304, 306, 308, 310 and 312 carrying input signals d0, d1, d2, d3, d4 and d5, respectively. Also, like 6-LUT 100, 6-LUT 300 includes a first 3-LUT 1-350, driven by inputs 304 and 306; a second 3-LUT 2-350, which can be driven either by inputs 304 and 306 or inputs 310 and 312, depending on the state of 2-MUX 316 and 2-MUX 214, respectively; and 3-LUT 3-350 which drives a first output 340 through 2-MUX 372. A second output 342 is driven by 2-MUX 320, which can be driven by either by the output of first 3-LUT 1-350 or second 3-LUT 2-350 based on input 302 which drives the selection input of 2-MUX 320. 6-LUT 300 also includes 2-MUX 322 and 2-MUX 324 which both drive third 3-LUT 3-350. 2-MUX 322 can pass either the output signal from first 3-LUT 1-350 or signal d4 from input 310 to drive third 3-LUT 3-350 and 2-MUX 324 can pass either the output signal from second 3-LUT 2-350 or signal d5 from input 312. The selection inputs of both 2-MUX 322 and 2-MUX 324 are controlled by user settable memory bit CR0'. Although in the embodiment shown in FIG. 3, 6-LUT 300 has only 7 inputs and 4 outputs, a 6-LUT in accordance with the present invention can include additional inputs and outputs.

Unlike 6-LUT 100, 6 LUT 300 includes input 309 carrying signal d3a, 2-MUXs 330 and 332, and outputs 344 and 346. Output 344 drives a first register, reg-1, and output 346 drives a second register, reg-0. The output of first 3-LUT 1-350 is driven by 2-MUX 354. Input 308 drives both the selection input of 2-MUX 354 and output 346. The output of second 3-LUT 2-350 is driven by 2-MUX 362. 2-MUX 330 passes either signal d3 on input 308 or signal d3a on input 309 to the selection input of 2-MUX 362 of second 3-LUT 2-350. Additionally, input 309 drives output 344. User settable memory bit CR1 drives the selection input of 2-MUX 330 to select between signal d3 on input 308 and signal d3a on input 309. Memory bit CR1 also drives the selection input of 2-MUX 332 which, in turn, drives the selection input of 2-MUX 372 with either signal d0 on input 302 or signal d3a on input 309. 6-LUT 300 includes memory bits 190. Memory 390 preferably includes fewer than 32 bits, and more preferably includes 26 bits, including memory bits CR0' and CR1, which are all that are necessary to unambiguously configure a 6-input logic function in 6-LUT 300.

Like 6-LUT 100 discussed above, 6-LUT 300 is fracturable. That is, it can be configured such that a first subset of the at least 7 inputs can drive a first output and a second subset of the at least 7 inputs can drive a second output. This allows function packing which, also as discussed above, can advantageously increase area efficiency.

In addition to being incomplete, 6-LUT 300 includes a seventh input, 309, and two additional outputs 344 and 346 which advantageously allow register packing. Register packing allows a register, or flip-flop, which is not being used by the logic element directly in front of it to be used by another logic element that is elsewhere in a logic block. In this way, if in a particular configuration of an FPGA in which each logic element includes a single register (as is commonly the case), a first logic element requires two registers and a second logic element does not require any registers, the register of the second logic element can be used by the first logic element.

The additional circuitry necessary to implement register packing in a fracturable, incomplete 6-LUT in accordance with the present invention (e.g., with respect to the embodiment shown in FIG. 3, input 309, outputs 344, 346, and 2-MUXs 330 and 332) requires approximately 3% additional area. Register packing in an FPGA, however, generally decreases the area necessary to implement a particular configuration. Thus, for relatively common FPGA configurations, use of 6-LUTs in accordance with the present invention including circuitry to allow register packing can advantageously reduce the area, and thus the cost, necessary to implement a particular FPGA configuration. Circuitry to allow register packing is described in detail in co-owned and co-pending U.S. patent application Ser. No. 10/280,723 filed Oct. 24, 2002 which is hereby incorporated by reference in its entirety. With the additional circuitry to allow register packing, 6-LUT 300 can be even more area efficient than 6-LUT 100 or the complete 6-LUT disclosed in Pederson, discussed above.

As noted above, 6-LUT 300 is incomplete, and, thus, can carry out only a subset of all 6-input logic functions. However, a 6-LUT including circuitry to allow register packing in accordance with the present invention, such as 6-LUT 300 can generally implement 6-input logic functions that an incomplete, fracturable 6-LUT that does not allow register packing, such as 6-LUT 100, cannot implement.

Figure 4:
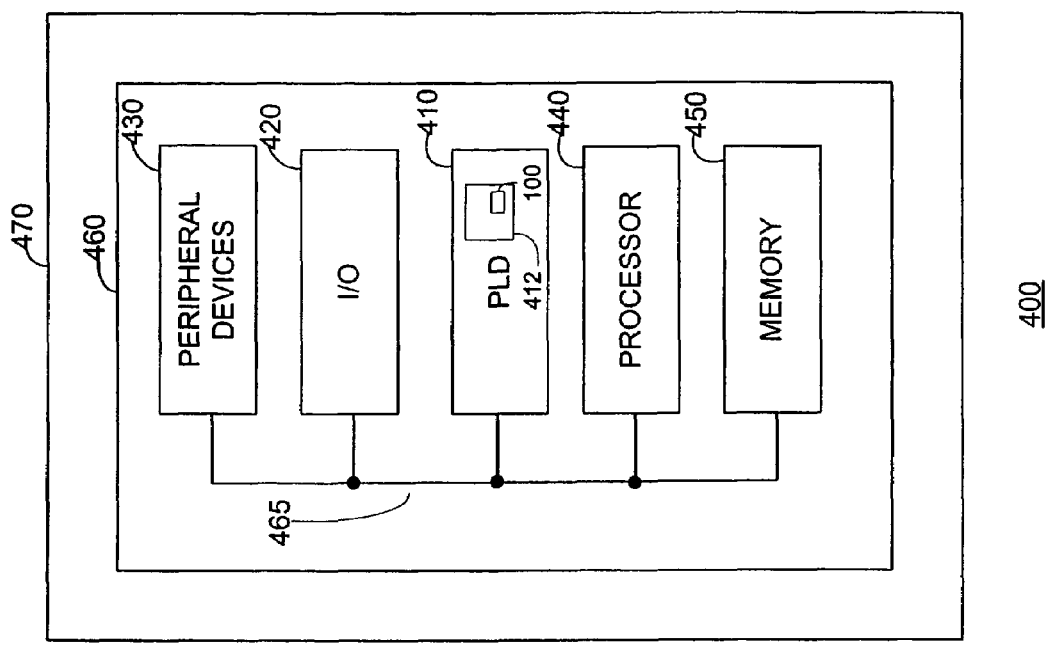
FIG. 4 is a block diagram illustrating a programmable logic device and data processing system implementing a programmable logic circuit in accordance with the present invention.

FIG. 4 illustrates a programmable logic device (PLD) 410 in a data processing system 400. As one example, the configurable logic circuits of the present invention may be implemented in logic elements of PLDs such as PLD 410. PLD 410 includes a plurality of logic array blocks (LABs) such as LAB 412 (only one LAB is shown to avoid over-complicating the drawing). LAB 412 includes a plurality of configurable logic circuits such as 6-LUT 100 (only one configurable logic circuit is shown to avoid overcomplicating the drawing). Data processing system 400 may include one or more of the following components: a processor 440; memory 450; I/O circuitry 420; and peripheral devices 430. These components are coupled together by a system bus 465 and are populated on a circuit board 460 which is contained in an end-user system 470.

System 400 can be used in a wide variety of applications, such as computer networking, data networking, instrumentation, video processing, digital signal processing, or any other application where the advantage of using programmable or re-programmable logic is desirable. PLD 410 can be used to perform a variety of different logic functions. For example, programmable logic device 410 can be configured as a processor or controller that works in cooperation with processor 440 (or, in alternative embodiments, a PLD might itself act as the sole system processor). PLD 410 may also be used as an arbiter for arbitrating access to a shared resources in system 400. In yet another example, PLD 410 can be configured as an interface between processor 440 and one of the other components in system 400. It should be noted that system 400 is only exemplary.

Although particular embodiments have been described in detail, various modifications to the embodiments described herein may be made without departing from the spirit and scope of the present invention, thus, the invention is limited only by the appended claims.

What is claimed is:

1. A configurable logic circuit comprising:
   at least 6 inputs;
   at least a first output and a second output;
   no more than 63 memory bits which are programmable to completely configure the logic function performed by the configurable logic circuit; and
   wherein the configurable logic circuit can be configured such that
      the at least 6 inputs drive the first output to generate a 6 input logic function; and
      the configurable logic circuit can also be separately configured such that a first subset of the at least 6 inputs drives the first output and a second subset of the at least 6 inputs drives the second output.

2. The configurable logic circuit of claim 1 wherein the no more than 63 memory bits includes no more than 25 memory bits.

3. The configurable logic circuit of claim 2 configurable to perform all possible 4 input logic functions.

4. The configurable logic circuit of claim 3 including a complete 4-LUT driven directly by at least 2 of the at least 6 inputs.

5. The configurable logic circuit of claim 4 including a complete 3-LUT directly driving the first output.

6. The configurable logic circuit of claim 5 wherein the complete 4-LUT includes at least 2 complete 3-LUTS.

7. The configurable logic circuit of claim 6 wherein an output of the complete 4-LUT drives the second output.

8. The configurable logic circuit of claim 1 including:
   at least a seventh input;
   a third output configurable to be directly driven by a first one of the at least seven inputs; and
   a fourth output configurable to be directly driven by second one of the at least seven inputs.

9. The configurable logic circuit of claim 8 wherein the plurality of memory bits includes no more than 26 memory bits.

10. The configurable logic circuit of claim 9 including a complete 4-LUT driven directly by at least 2 of the at least 6 inputs.

11. The configurable logic circuit of claim 10 including a complete 3-LUT directly driving the first output.

12. The configurable logic circuit of claim 11 wherein the complete 4-LUT includes at least 2 complete 3-LUTS.

13. The configurable logic circuit of claim 12 wherein an output of the complete 4-LUT drives the second output.

14. A programmable logic device comprising the configurable logic circuit of claim 1.

15. A data processing system comprising the programmable logic device of claim 14.

16. A configurable logic circuit comprising:
   at least 6 inputs;
   at least a first output and a second output;
   3 complete 3-LUTs; and
   wherein the configurable logic circuit can be configured such that the at least 6 inputs drive the first output to generate a 6 input logic function; and the configurable logic circuit can also be separately configured such that a first subset of the at least 6 inputs drives the first output and a second subset of the at least 6 inputs drives the second output.

17. The configurable logic circuit of claim 16 wherein a first of the no more than 3 complete 3-LUTs directly drives the first output.

18. The configurable logic circuit of claim 17 wherein a second and third of the no more than 3 complete 3-LUTs are included in a complete 4-LUT.

19. The configurable logic circuit of claim 18 wherein at least 2 of the at least 6 inputs can be configured to drive either the complete 4-LUT or the first of the no more than 3 complete 3-LUTs.

20. The configurable logic circuit of claim 19 configurable to perform all possible 4 input logic functions.

21. The configurable logic circuit of claim 20 wherein an output of the complete 4-LUT drives the second output.

22. The configurable logic circuit of claim 1 including:
   at least a seventh input;
   a third output configurable to be directly driven by a first one of the at least seven inputs; and
   a fourth output configurable to be directly driven by second one of the at least seven inputs.

23. A programmable logic device comprising the configurable logic circuit of claim 16.

24. A data processing system comprising the programmable logic device of claim 23.

25. A configurable logic circuit comprising:
   at least 6 inputs;
   at least a first output and a second output;
   no more than 25 memory bits which are programmable to completely configure the logic function performed by the configurable logic circuit; and
   wherein the configurable logic circuit can be configured such that one of either;
      the at least 6 inputs drive the first output to generate a 6 input logic function; and
      a first subset of the at least 6 inputs drives the first output and a second subset of the at least 6 inputs drives the second output.

* * * * *